United States Patent [19]
Strobel et al.
[11] Patent Number: 4,868,566
[45] Date of Patent: Sep. 19, 1989

[54] FLEXIBLE PIEZOELECTRIC SWITCH ACTIVATED METERING PULSE GENERATORS

[75] Inventors: Donald H. Strobel, Cedarburg; Lee L. Karsten, Thiensville; John D. Stolz, Milwaukee, all of Wis.

[73] Assignee: Badger Meter, Inc., Milwaukee, Wis.

[21] Appl. No.: 189,533

[22] Filed: May 3, 1988

[51] Int. Cl.⁴ ...................... G08C 19/16; G08C 19/38; G01R 11/30

[52] U.S. Cl. ................................ 340/870.3; 324/157; 310/339

[58] Field of Search ................ 324/157, 168; 310/339, 310/318, 319, 338; 340/870.3

[56] References Cited

U.S. PATENT DOCUMENTS 3,962,691 6/1976 Longenfield .................... 340/870.3
4,584,499 4/1986 Leskovec et al. .................. 310/318
4,585,970 4/1986 Koal et al. ......................... 310/339
4,763,078 8/1988 Williams ............................ 324/458

*Primary Examiner*—Reinhard J. Eisenzopf
*Assistant Examiner*—Anthony L. Miele
*Attorney, Agent, or Firm*—Neuman, Williams, Anderson & Olson

[57] ABSTRACT

In a metering pulse generator, a metering element engages a spring member to effect a gradual bending movement in one direction followed by a rapid return movement during which a pulse signal is developed by a piezoelectric material on the spring member . Energy is absorbed during each such rapid return movement of the spring member to provide damping, inhibit oscillations and effect reliable generation of a single pulse signal which is applied to an amplifier for transmission to a monitoring station.

15 Claims, 4 Drawing Sheets

FLEXIBLE PIEZOELECTRIC SWITCH ACTIVATED METERING PULSE GENERATORS

BACKGROUND OF THE INVENTION

1. Field of the Invention

This invention relates to metering pulse generators and more particularly to devices for installation on gas or water meters or the like to develop electrical pulses for transmission to a remote monitoring location. Metering pulse generators of the invention supply pulses of controlled amplitude and width, require a very low torque input, have minimal standby power requirements and a long operating life. The generators are quite compact and readily installed, are comparatively simple in construction and operation and are manufacturable at low cost.

2. Background of the Prior Art

Devices have heretofore been provided for developing pulses in response to rotation of dial arms of gas, water or other utility meters or the like. For example, the Sears U.S. Pat. No. 4,470,010 discloses an apparatus in which a dial arm of a meter engages a shoe which is affixed to one end of a shaft to rotate the shaft against the action of a coiled spring wrapped around the shaft. At its opposite end, the shaft has a striker arm portion which is engageable with a bar of piezoelectric material to generate an impulse. The impulse is transmitted through wires to remotely located circuitry. Many other types of metering pulse generators have been provided but the results obtained have been generally unsatisfactory and the devices have been complex, expensive and relatively large in size and not easily installed. A particular problem relates to energy consumption, particularly when the metering pulses are to be transmitted by devices designed for battery operation. For example, in devices designed to transmit metering data to a utility control center through a telephone line, it is desirable to use batteries to avoid the trouble, expense and possible hazards of obtaining power from an AC line. At the same time, it is desirable to minimize the expense of sending out service personnel to replace batteries and it is therefore desirable to minimize energy consumption and extend battery life as much as possible.

SUMMARY OF THE INVENTION

This invention was evolved with the general object of providing metering pulse generators which have minimal energy consumption and which impose minimal mechanical loads on meters on which they are installed, while reliably generating metering pulses for transmission to a remote location. It is also an object of the invention to provide metering pulse generators which have a very compact size and which are easily installed and which are also economically manufacturable.

In accordance with this invention, a sensor is engaged and deformed by a metering element to develop an electrical signal, the sensor preferably comprising a deformable spring member and a sensing device directly secured thereto. Thus, an electrical signal is directly generated in response to movement of the metering element and a simplified and compact device is provided. In preferred embodiments, the spring member is of resilient sheet material which is bent through engagement by a metering element and a strip of piezoelectric material is secured to the spring member to generate electrical signals in response to bending thereof.

Very important features relate to the provision of an amplifier device in close proximity to the sensor and arranged to respond to the electrical signal developed by the sensor to transmit an output pulse signal to a remote location. Preferably, the amplifier device and associated circuit components are mounted directly on the spring member and the spring member is of insulating material and functions as a printed circuit board for connections between the sensor and amplifier device and circuit components.

In accordance with another important feature, the sensor is arranged to develop a single high amplitude pulse signal of one polarity and the amplifier device is switched from a non-conductive state to a conductive state in response to each high amplitude pulse signal applied thereto. Thus, there is significant energy consumption only during development of the pulse signal.

Specific features relate to the development of the single high amplitude pulse signal in a manner such as to insure accurate and reliable metering. In generators constructed in accordance with the invention, a bending movement of the spring member is gradually effected away from an initial rest condition and then the spring member is released to effect a rapid return movement to the rest condition. The high amplitude pulse is developed during the rapid return movement. In particular, with the piezoelectric sensing device, a charge of one polarity developed during the movement away from the rest condition is allowed to gradually leak away, and the high amplitude pulse is developed in response to a charge of the opposite polarity which is developed during the rapid return movement.

Oscillations of the member and the possibility of resultant multiple pulse generations are avoiding by damping and absorbing the energy of the spring member as it is rapidly returned to the initial rest position. Preferred methods include the absorption of energy in air which is entrapped between the spring member to be pressurized and displaced during the return movement and the provision of a stop structure which is engaged by the spring member to absorb energy and limit any substantial excursion beyond the initial rest condition.

This invention contemplates other objects, features and advantages which will become more fully apparent from the following detailed description taken in conjunction with the accompanying drawings.

DESCRIPTION OF PREFERRED EMBODIMENTS

Figure 1:
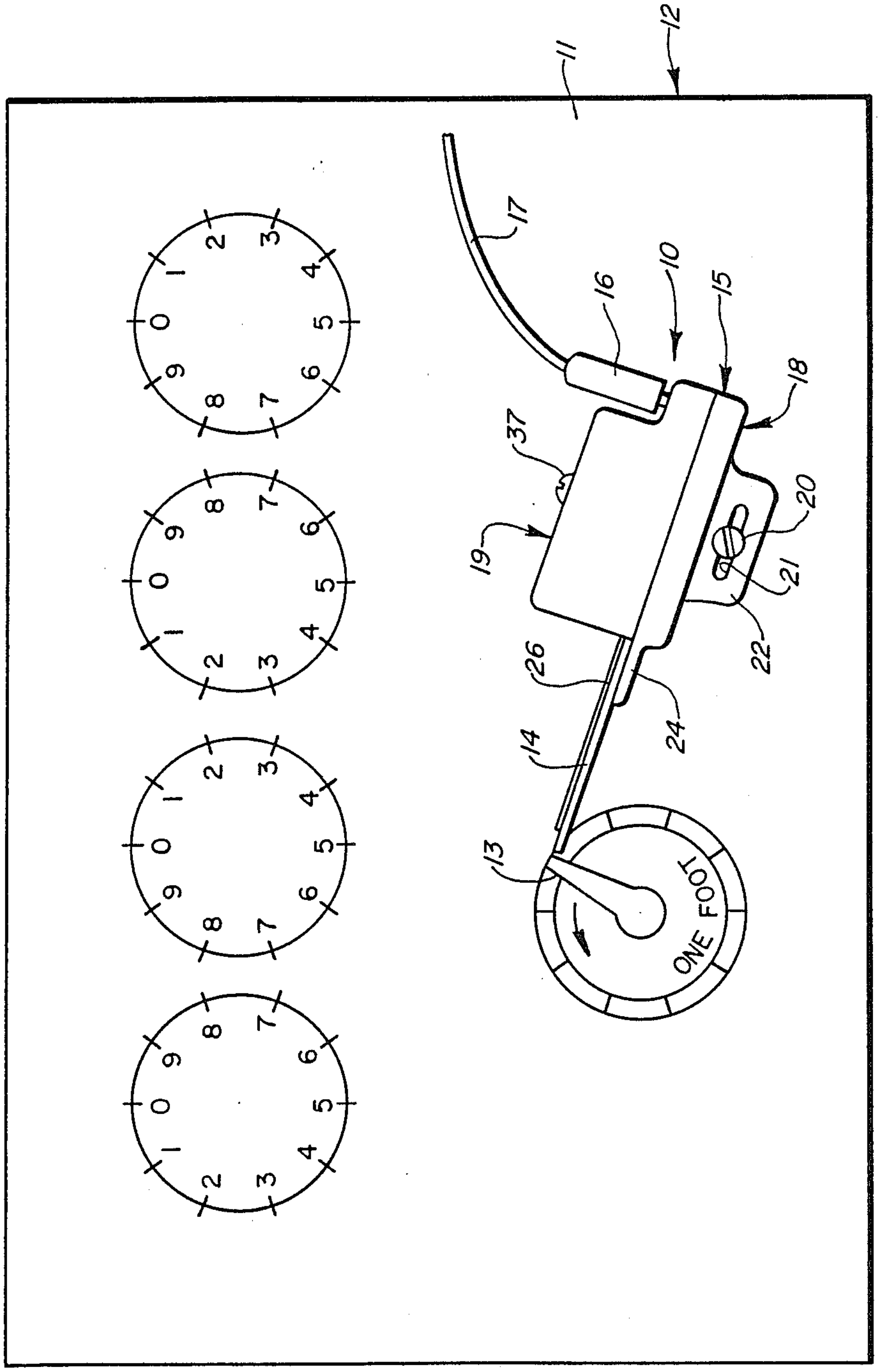
FIG. 1 is a front elevational view showing a metering pulse generator of the invention mounted on the face of a gas meter.
Figure 2:
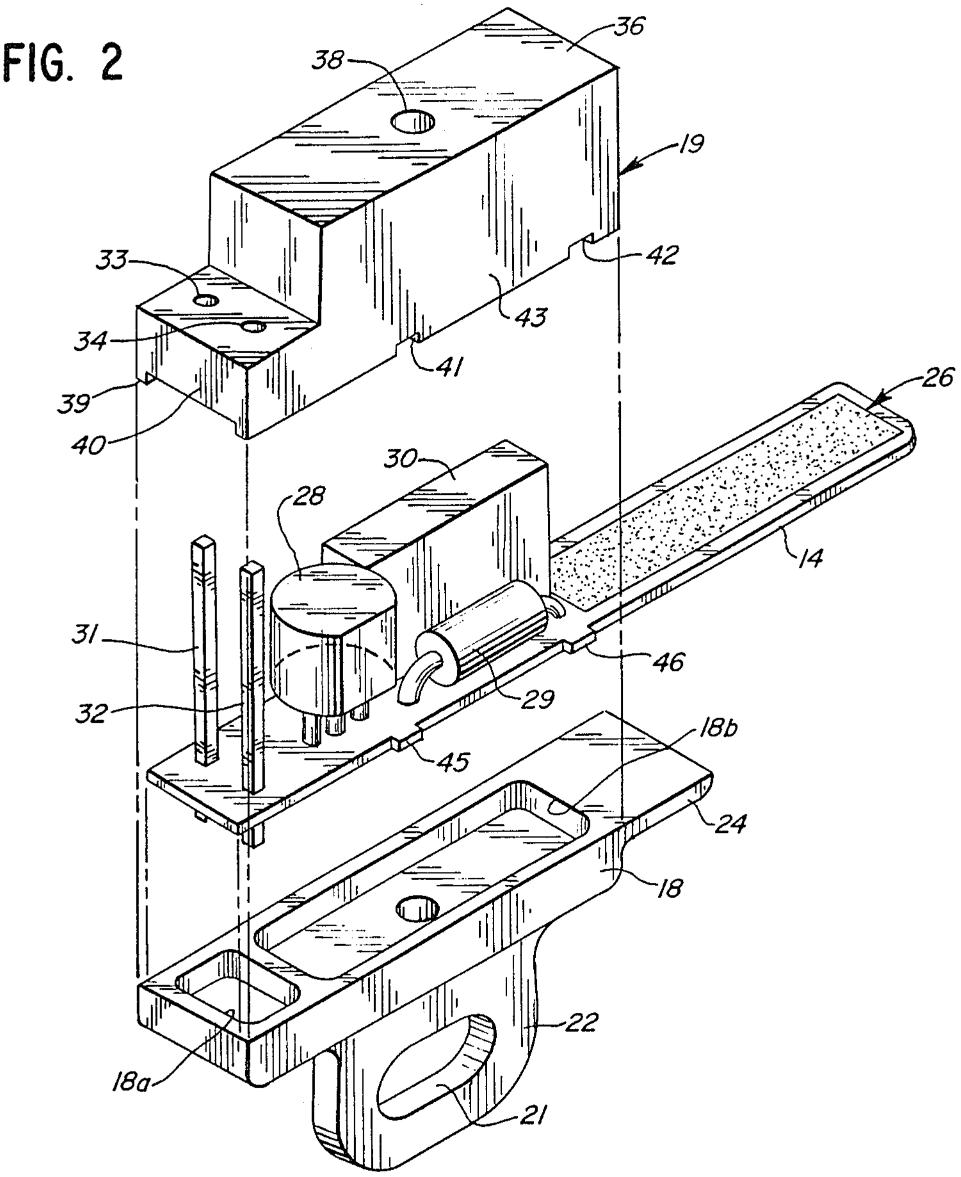
FIG. 2 an isometric exploded view, showing the construction of components of the pulse generator of FIG. 1 and the manner of assembly thereof.

Reference numeral 10 generally designates a pulse generating device which is constructed in accordance with the principles of this invention. As shown in FIG. 1, the device 10 may be mounted on the face 11 of a gas meter 12 and is designed to produce a pulse in response to each rotation of a dial pointer 13. The illustrated device 10 includes a member 14 of resilient sheet material which extends from a housing 15 and which has a terminal end portion 14a engageable by the end of the dial pointer. In the arrangement as shown in FIG. 1, the pointer 13 rotates in a counter-clockwise direction and it engages the member 14 to effect a gradual bending movement of the member 14 away from an initial rest position. When the pointer 13 reaches a certain angular position, the resiliency of the member operates to effect a relatively rapid return movement of the member to an initial rest position as shown.

The device 10 generates an electrical pulse signal in response to the rapid return movement of the spring member and has output terminals for connection to a connector 16 at one end of a cable 17, for transmission of the signal to a remote location which may be several feet away. By way of example, the device 10 may be used to transmit metering pulses to an automatic meter reader or "AMR" which is arranged to periodically transmit metering data through a telephone line to a utility control center. The AMR is preferably battery operated and it is highly desirable that current consumption be minimized. Accuracy, reliability and a long operating life are also extremely important.

The housing 15 comprises a bottom cover or base 18 and a top cover 19 both of which may be injection-molded plastic parts. Mounting arrangements may vary in accordance with the type and construction of the particular meter on which the device is mounted. In the illustrated construction, a screw 20 has a shank extending through a slot 21 in an integral tab portion 22 of the base 18. The slot 21 is elongated in a direction generally parallel to the member 14 and permits accurate adjustment of the positional relationship of the member 14 relative to the path of movement of the end of the meter pointer 13.

The bottom cover or base 18 also includes an integral tab 24 at one end which extends along the lower side of the member 14 and toward the free terminal end portion 14a thereof. The tab 24 operates as a damping means to control the duration of the return movement of the member 14 and to inhibit oscillation thereof. During such return movement, a cushion of air is developed between the member 14 and the tab 24 and is pressurized and displaced to absorb a portion of the energy stored during bending of the member 14 after which the member 14 engages the tab 24 to mechanically absorb the remaining energy.

Important features of the invention relate to the development of the electrical pulse signals in response to return movement of the spring member. A deformation sensing means is secured to the spring member 14, preferably comprising a very thin and lightweight piezoelectric transducer 26 which is adhesively secured to the upper surface of the spring member 14. An electronic amplifying device is also provided which is preferably a field-effect transistor 28 mounted on the spring member 14 in close proximity to the transducer 26 and connected thereto through circuitry which is also mounted on the spring member.

In the illustrated device 10, the spring member supports a resistor 29 and a rectangular package 30 which contains two resistors. A pair of pins 31 and 32 are provided which form output terminals and which extend upwardly through openings 33 and 34 in a wall portion 35 of the top cover 19 and into the connector 16 of the cable 17. The pins 31 and 32 are inserted in holes in the spring member 14 and, when the device is assembled, lower ends of the pins engage in underlying recesses in the base 18, for mechanical support and rigidity. A further feature is that the spring member 14 is of an electrically insulating material and forms a printed circuit board with traces of copper or the equivalent formed thereon to provide connections between the transducer 26, transistor 28 and resistor 29 and the resistors in package 30. Thus the spring member 14 performs a number of important functions and a very compact assembly is provided.

The top cover 19 includes an upper wall portion 36 which is overlies the transistor 28, resistor 29 and resistor package 30. Cover 19 may be secured to the base through a connecting screw 37 extended through a central hole 38 in the cover 19 and thence downwardly through a hole in the member 14 and into a hole in the base 18. The cover 19 is also formed with a slot 39 in one end wall 40 and a similar slot in the opposite end wall for embracing the spring member 14, and with a pair of notches 41 and 42 in one side wall 43 and similar notches in an opposite side wall for receiving tabs 45 and 46 which project from one side of the member 14 and similar tabs which project from the opposite side of the member 14. Thus the member 14 is securely held in position relative to the housing 15.

After assembly of the transducer 26, transistor 28, resistor components 29 and 30 and pins 31 and 32 on the member 14, electrical connections are effected, preferably by wave soldering. As shown, the base 18 is formed with recesses 18a and 18b for providing space to receive terminals and portions of the components which project from the underside of the member 14.

Figure 3:
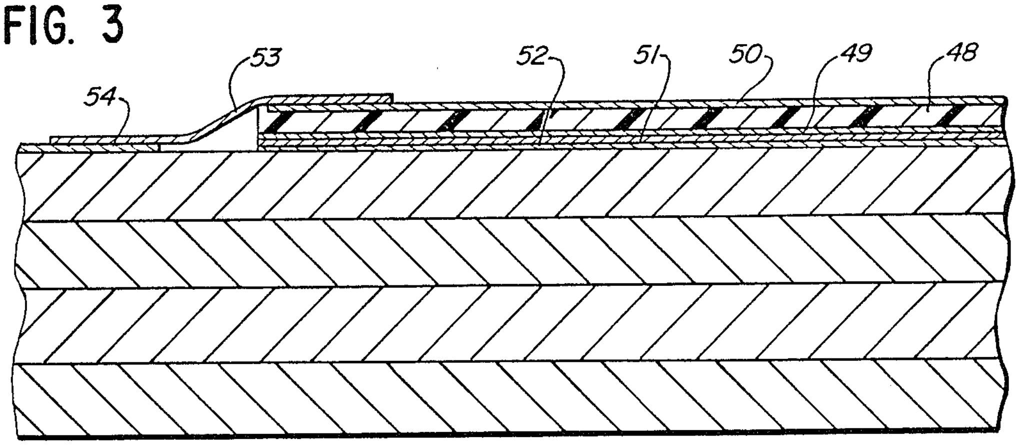
FIG. 3 is a cross-sectional view on an enlarged scale and with certain thicknesses exaggerated, showing the construction of a piezoelectric film transducer and the mounting thereof on a spring member of the generator.

FIG. 3 is a cross-sectional view with certain thicknesses exaggerated to show how the transducer 26 is constructed and assembled on the member 14. The transducer 26 is in the form of a thin film of a piezoelectrically active material and electrodes secured thereto. By way of example it may preferably comprise a polyvinylidene fluoride film 48 which is approximately 0.200 inches long by 0.750 inches wide and 28 microns thick and which has electrodes 49 and 50 silk-screened onto its opposite faces. An adhesive 51 is provided between the lower electrode 49 and the upper face of the member 14 to secure the transducer 26 to the member 14. The adhesive 51 is a conductive adhesive to also function to provide an electrical connection between the electrode 49 on the lower face of the film 48 and a copper trace 52 on the upper face of the member. A connection 53 is similarly provided between the upper electrode 50 and a copper trace 54 on the member 14 which is electrically separate from the trace 52.

Figure 4:
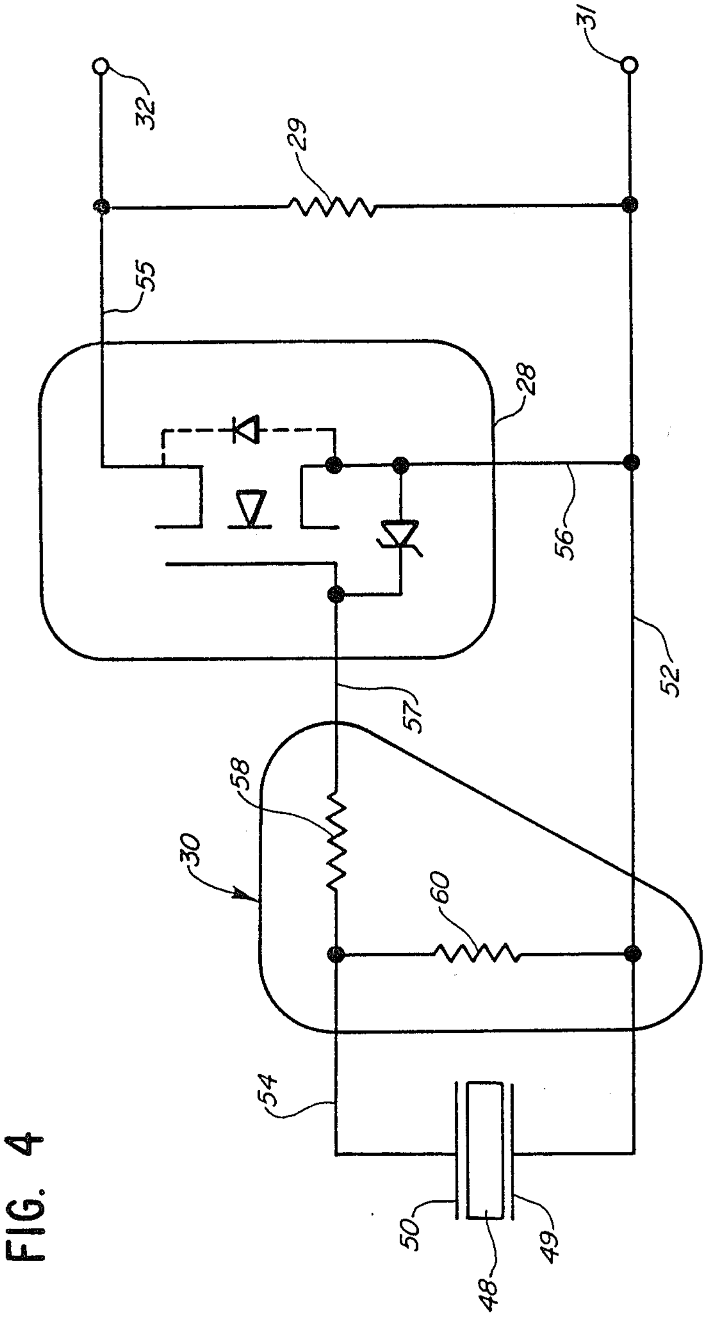
FIG. 4 is a circuit diagram, showing connections of components of the generator.

FIG. 4 is a circuit diagram. As shown, the transistor 26 is an N channel enhancement mode, metal oxide field effect transistor or "MOSFET". It has a drain electrode 55 connected to the pin 32 and to one terminal of the resistor 29 and a source electrode 56 connected to the pin 31, to the other terminal of resistor 29 and also to the transducer electrode 49 through the trace 52. A gate electrode 57 is connected to a terminal of one resistor 58 of the package 30, the other terminal of the resistor 58 being connected to the transducer electrode 50 through the trace 54. A second resistor 60 of the package 30 is connected between traces 52 and 54, in parallel relation to the transducer 26.

In operation, the film 48 develops a charge between its opposite faces when deformed during bending of the member 14. The film 48 is compressed during bending of the member 14 away from its rest position, developing a charge having a polarity such that the voltage of the electrode 50 is negative relative to the electrode 49. The polarity of the charge so developed during bending is opposite that required to cause conduction of the transistor 28. Such bending takes place relatively slowly and the charge gradually bleeds off through the resistor 60. When the spring member is released to move relatively rapidly back to its initial rest position, the charge is changed in the opposite direction and a voltage is developed at the electrode 50 which is of positive polarity and which is such as to cause conduction of the transistor 28 for a certain time interval, dependent upon the amount of deflection and the values and characteristics of the components. When the voltage at the gate electrode 57 is sufficient to initiate conduction of the transistor 28, the effective resistance between the gate and source electrodes 57 and 56 is relatively low as compared to the resistances of the resistors 58 and 60. Consequently, the electrical values which affect the conduction time are the values of the resistors 58 and 60, the capacitance of the transducer 26 and the voltage generated by the film during deflection, the capacitance of transducer 26 and the generated voltage being a function of the thickness and effective area of the film 48, its composition and the deflection thereof.

By way of illustrative example, and not by way of limitation, the types and values of the components may be as follows:

| Reference number | Type or value |
|---|---|
| 28 | Silconix VN2222L |
| 29 | 249,000 ohms |
| 58 | 10 megohms |
| 60 | 22 megohms |

The film 48 of the transducer may be a polyvinylidene fluoride film marketed by Pennwalt Corporation under the trade name "KYNAR", approximately 0.200 inches wide, 0.750 inches long and 28 microns in thickness. The spring member 14 may be a multilayer epoxy/glass fabric laminate of a type used in conventional circuit boards, approximately 1.5 inches long, 0.200 inches wide and 0.020 inches thick, with copper surface paths on both surfaces and with holes for insertion of the terminals or leads of the transistor and resistor components. After wave soldering of the leads, a conformal coating may be applied to protect the assembly from the environment.

Only a very small force is required to obtain the required deflection of the spring member 14 but the desired electrical pulse signals are generated with a high degree of reliability. The duration of conduction of the transistor 26 may range from 2 to 20 milliseconds depending upon the deflection of member 14. The resistance between the pins 31 and 32 may be on the order of 7.5 ohms during conduction of the transistor 28 and is substantially the same as that of the resistor 29, i.e. 249,000 ohms, during non-conduction of the transistor 28.

With the aforementioned mechanical damping and electrical characteristics, clean and uncluttered electrical pulse signals can be transmitted through substantial distances to a monitoring station and a very reliable and trouble-free metering operation is obtained.

Figure 5:
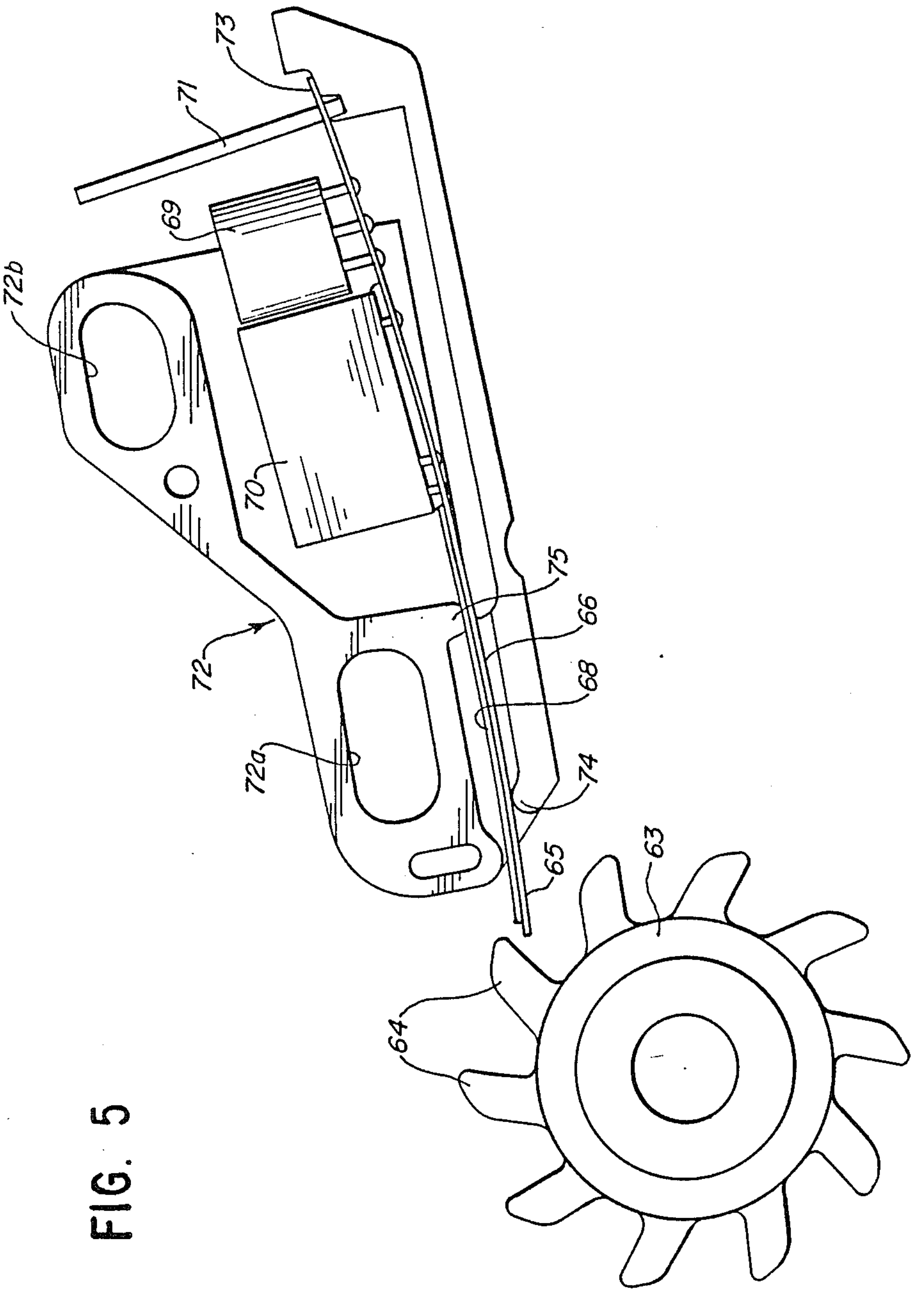
FIG. 5 is a front elevational view showing a modified metering pulse generator of the invention and diagrammatically showing the mounting thereof on a water meter, but with a cover of the generator removed to show the internal construction.

FIG. 5 is a view illustrating portions of a modified device 62, shown with a cover thereof removed and shown in relation to a rotating meter element 63. Element 63 may be an element of a water meter, for example, to be rotated in proportion to the volume of water flowing through a metering mechanism. As shown, it has 10 arcuately spaced cam fingers 64 on its periphery which are engageable with a terminal end portion 65 of a spring member 66 of the device 62.

Spring member 66 of device 62 is like the member 14 of the device 10 and has transducer and circuit components mounted thereon in the same way, including a piezoelectric film transducer 68 like transducer 26, a field-effect transistor 69 like transistor 28, a pair of resistors in a package 70, corresponding to resistors 58 and 60 in package 30, and an additional resistor which is not seen in FIG. 5 but which is like resistor 29 and behind the package 70. A pair of pins which are like pins 31 and 32 are secured to member 66 adjacent one end thereof to form output terminals, as indicated by reference numeral 71.

A housing 72 is provided which is formed with slots **72*a* and 72*b* for receiving screws to mount the device on the face of a meter. The housing 72 is formed to provide a slot for receiving and supporting the member 66 in a slightly bowed configuration when in an initial rest condition thereof, the member 66 being engaged by a shoulder 73 and two ribs 74 and 75 which extend transversely relative to the member 66 at longitudinally spaced positions. The shoulder 73 engages the underside of the end portion of the member 66 adjacent the pins 71. The rib 74 engages a portion of the spring member 66 which is spaced from the terminal end portion 65 thereof engaged by the cam fingers 64. The rib 75 engages the upper side of the member 66 at a position which is intermediate the shoulder 73 and the rib 74, in the longitudinal direction, and is located below a plane through the shoulder 73 and the rib 74, thereby holding the member 66** in a bowed condition.

When the meter element 63 is rotated, each of the cam fingers 64 engages the terminal end portion of the spring member 66 to move the spring member 66 upwardly away from the rib 74, a fulcrum point being provided by the rib 75. When each cam finger 64 reaches a certain position, the member 66 is released to move rapidly back toward the initial rest position as illustrated, and a high amplitude pulse is generated by the transducer 68 of a polarity such as to cause conduction of the transistor 69. When the spring member 66 reaches the initial rest position, it engages the rib 74 which absorbs energy and limits any substantial excursion beyond the rest condition. The arrangement prevents any deformation of the transducer 68 which might produce a pulse of an amplitude and polarity such as to cause development of a second pulse. The result is that a single and very clean high amplitude pulse is generated in response to movement of each cam finger into engagement with the member 66.

It will be understood that modifications and variations may be effected without departing from the spirit and scope of the novel concepts of this invention.

We claim:

1. A pulse signal generating device for responding to movements of metering elements or the like and transmitting pulse signals to a monitoring station, said device comprising: sensor means positionable to be engaged and deformed by a metering element and to develop an electrical signal during movement of the metering element through a certain portion of a path of movement thereof, and an amplifier device having input electrode means coupled to said sensor means and output electrode means arranged for coupling through connecting wire means to the monitoring station, said sensor means comprising a spring member of resilient sheet material having a terminal end portion for extending into the path of movement of the metering element to effect a bending movement in one direction away from an initial rest condition and a return movement in the opposite direction back to said initial rest condition, and deformation sensing means for developing an electrical signal in response to bending movements of said spring member, said spring member being so arranged and positioned in said path of movement of said metering element as to gradually effect said bending movement in said one direction and to relatively rapidly effect said return movement to said initial rest condition after said metering element reaches a certain position, and damping and oscillation inhibiting means for controlling the duration of said return movement to control the duration of the generated pulse signal and for inhibiting oscillatory movement of said spring member following movement of said spring member back to said initial rest condition.

2. A pulse signal generating device as defined in claim 1, said deformation sensing means being mounted on one surface of said spring member to be deformed with said spring member during said bending and return movements thereof.

3. A pulse signal generating device as defined in claim 2, said resilient sheet material being an electrically insulating material and said amplifier device being mounted on said sheet material, and circuit means on said spring member connecting said sensing means to said input electrode means of said amplifier device.

4. A pulse signal generating device as defined in claim 2, said sensing means comprising a thin layer of piezoelectric material secured against said one surface of said spring member.

5. A pulse signal generating device as defined in claim 4, said resilient sheet material of said spring member being an electrically insulating material, a pair of electrodes on opposite surfaces of said thin layer of piezoelectric material, conductive layer means bonded to said one surface of said spring member, and a conductive adhesive between a portion of said conductive layer means and one of said pair of electrodes.

6. A pulse signal generating device as defined in claim 5, said amplifier device being mounted on said sheet material, and circuit means mounted on said spring member and connecting the other of said pair of electrodes and said conductive layer means to said input electrode means of said amplifier device.

7. A pulse signal generating device as defined in claim 1, said damping and oscillation inhibiting means including means providing a surface in close proximity to a surface of said spring member such as to absorb energy in air which is entrapped and pressurized and displaced during said return movement of said spring member back to said initial rest condition.

8. A pulse signal generating device as defined in claim 1, said damping and oscillation inhibiting means including stop means limiting return movement of said spring member in said opposite direction beyond said initial rest condition.

9. A pulse signal generating device as defined in claim said deformation sensing means including a piezoelectric film secured to one surface of said spring member for developing said electrical signal in response to bending movements of said spring member said piezoelectric film being operative during said gradual movement in said one direction to develop a charge of one polarity which is gradually bled off during said gradual movement and being operative during said rapid return movement to develop a short duration relatively high charge voltage of the opposite polarity.

10. A pulse signal generating device as defined in claim 9, an amplifier device in close proximity to said deformation sensing means and arranged to respond to said short duration relatively high voltage of said opposite polarity to be shifted from a non-conductive state to a conductive state.

11. A pulse signal generating device as defined in claim 9, means supporting said spring member in a bowed configuration when in said rest condition.

12. A pulse signal generating device for responding to movements of metering elements or the like and transmitting output pulse signals to a monitoring station, said device comprising: sensor means positionable to be engaged and deformed by a metering element and to develop an electrical signal during movement of the metering element through a certain portion of a path of movement thereof, and an amplifier device in close proximity to said sensor means and having input electrode means coupled to said sensor means and output electrode means arranged for coupling through connecting wire means to the monitoring station, said sensor means being arranged to develop a single high amplitude pulse signal of one polarity during each movement of the metering element through said certain portion of its path of movement, and said amplifier device being normally non-conductive and being rendered conductive for-transmission of an output pulse signal to a monitoring station in response to application of each high amplitude pulse signal of said one polarity to said input electrode means thereof, whereby significant energy consumption by said amplifier device takes place only during said high amplitude pulse signal and is minimized.

said sensor means comprising a spring member of resilient sheet material having a terminal end portion for extending into the path of movement of the metering element to effect a bending movement in one direction away from an initial rest condition and a return movement in the opposite direction back to said initial rest condition, and deformation sensing means for developing an electric signal in response to bending movements of said spring member, said spring member being so arranged and positioned in said path of movement of said metering element as to gradually effect said bending movement in said one direction and to relatively rapidly effect said return movement to said initial rest condition after said metering element reaches a certain position, and damping and oscillation inhibiting means for controlling the duration of said return movement to control the duration of the generated pulse signal and for inhibiting oscillatory movement of said spring member following movement of said spring member back to said initial rest condition, to facilitate development of said single high amplitude development of said single high amplitude pulse signal of one polarity during each return movement of said metering element.

13. A pulse signal generating device as defined in claim 12 said damping and oscillation inhibiting means including means providing a surface in close proximity to a surface of said spring member such as to absorb energy in air which is entrapped and pressurized and displaced during said return movement of said spring member back to said initial rest condition.

14. A pulse signal generating device as defined in claim 12, said damping and oscillation inhibiting means including stop means limiting return movement of said spring member in said opposite direction beyond said initial rest condition.

15. A pulse generating device as defined in claim 12, further including impedance means in proximity to said amplifier device and coupled between said output electrode means to be coupled through said connecting wire means to the monitoring station and to present a certain impedance at the monitoring station in the normal non-conductive state of said amplifier means.

* * * * *

UNITED STATES PATENT AND TRADEMARK OFFICE
CERTIFICATE OF CORRECTION

PATENT NO. : 4,868,566

DATED : September 19, 1989

INVENTOR(S) : Donald H. Strobel, et al

It is certified that error appears in the above-identified patent and that said Letters Patent is hereby corrected as shown below:

In the citation of references "Longenfield" should read --Langenfield--.
Column 2, line 55, after "2", insert --is--.
Column 4, line 50, "long" should be --wide--.
Column 4, line 50, "wide" should be --long--.
Column 7, Claim 1, line 3, after "elements" delete --or the like--.
Column 8, Claim 9, line 6, after "claim" insert --1,--.
Column 8, Claim 9, line 10, after "member" insert --,--.
Column 8, Claim 12, line 28, after "elements" delete --or the like--.
Column 8, Claim 12, line 44, after "for" delete the --hyphen (-)--.
Column 8, Claim 12, line 50, after "minimized" delete "." and insert --,--.
Column 9, Claim 12, line 5, after"amplitude" delete --development of said single high amplitude--.
Column 9, Claim 13, line 9, after "12" insert --,--.

Signed and Sealed this

Fourth Day of December, 1990

*Attest:*

HARRY F. MANBECK, JR.

*Attesting Officer*

*Commissioner of Patents and Trademarks*